United States Patent [19]

Mahulikar et al.

[11] Patent Number: 5,013,871
[45] Date of Patent: May 7, 1991

[54] KIT FOR THE ASSEMBLY OF A METAL ELECTRONIC PACKAGE

[75] Inventors: Deepak Mahulikar, Meriden; Jacob Crane, Woodbridge, both of Conn.; Jeffrey S. Braden, Milpitas, Calif.

[73] Assignee: Olin Corporation, New Haven, Conn.

[21] Appl. No.: 461,861

[22] Filed: Jan. 8, 1990

Related U.S. Application Data

[63] Continuation-in-part of Ser. No. 154,544, Feb. 10, 1988, Pat. No. 4,897,508.

[51] Int. Cl.$^5$ .............................................. H01L 23/02
[52] U.S. Cl. ............................... 174/52.4; 174/17 GF; 357/74
[58] Field of Search ................ 174/52.4, 17 GF; 357/74, 81, 70

[56] References Cited

U.S. PATENT DOCUMENTS

| | | |
|---|---|---|
| 3,728,177 | 4/1973 | Caule . |
| 3,871,018 | 3/1975 | Jackson et al. . |
| 3,943,623 | 3/1976 | Mizutani et al. . |
| 4,105,861 | 8/1978 | Hascoe . |
| 4,330,790 | 5/1982 | Burns . |
| 4,410,927 | 10/1983 | Butt . |
| 4,461,924 | 7/1984 | Butt . |
| 4,521,469 | 6/1985 | Butt et al. . |
| 4,525,422 | 6/1985 | Butt et al. . |
| 4,582,556 | 4/1986 | Butt et al. . |
| 4,656,494 | 4/1987 | Butt . |
| 4,697,203 | 9/1987 | Sakal et al. . |
| 4,769,345 | 9/1988 | Butt . |
| 4,812,896 | 3/1989 | Rothgery et al. . |
| 4,816,426 | 3/1989 | Bridges et al. . |
| 4,827,376 | 5/1989 | Voss . |
| 4,849,857 | 7/1989 | Butt . |
| 4,872,047 | 10/1989 | Fister et al. . |
| 4,888,449 | 12/1989 | Crane et al. ........................ 174/52.1 |

FOREIGN PATENT DOCUMENTS

WO89/0644 2/1989 PCT Int'l Appl. .

*Primary Examiner*—Leo P. Picard
*Assistant Examiner*—Bot L. Ledynh
*Attorney, Agent, or Firm*—Gregory S. Rosenblatt; Paul Weinstein

[57] ABSTRACT

A kit for the assembly of an adhesively sealed package designed to encase an electronic device is provided. The kit comprises a metallic base and cover components which are adapted to receive a polymeric adhesive. At least those portions of the base and cover component which will contact the polymeric adhesive are provided with a coating of a second metal or oxide. In one embodiment, first, second and third dry film adhesives are tacked to the base and cover components.

15 Claims, 4 Drawing Sheets

KIT FOR THE ASSEMBLY OF A METAL ELECTRONIC PACKAGE

This application is a continuation in part of U.S. Pat. No. 4,897,508 entitled "Metal Electronic Package" by Deepakl Mahulikar et al, Ser. No. 154,544, filed Feb. 10, 1988 and assigned to a common assignee.

While the invention is subject to a broad range of applications, it particularly relates to a kit containing a plurality of components adapted for the assembly of a metal electronic package. More particularly, the invention relates to a kit containing metal base and cover components which are adhesively sealed to a leadframe thereby forming an electronic package.

U.S. Pat. Ser. No. 154,544 discloses a process for the assembly of a metal electronic package. A leadframe containing a centrally positioned die attach pad is provided. Leads approach the centrally positioned pad from one or more sides. Typically, the leads approach from two sides (known as a DIP, dual-in-line package) or four sides (known as a guad package).

The electronic device is typically an integrated circuit device, such as a silicon based semiconductor circuit. It is bonded to the centrally positioned die attach pad on the leadframe with a die attach. The die attach may be either electrically conductive or electrically insulating depending on the desired characteristics of the integrated circuit device. Among the electrically conductive materials used for a die attach are eutectic solders such as gold/silicon and 95% lead/5% tin. Non-eutectic soft solders such as 60%lead/40% tin or 92.5%lead/5%tin/2.5%silver are also employed. Polymer adhesives, such as heat-curable epoxies are also used. The epoxy may be made electrically conductive by filling it with a conductive metal, for example, silver powder. If an electrically insulating die attach material is desired, an unfilled polymer adhesive or a sealing glass may be employed. Polymer adhesive having a low concentration of metal powder may also be used. The low level of metal powder increases thermal dissipation.

The electronic device is connected to the inner lead portions of the leadframe through bonding wires. The bonding wires are frequently made from thin, about 0.001 inch diameter wires of gold or aluminum. In the alternative, thin strips of copper foil are used for tape automated bonding (TAB) as disclosed U.S. Pat. No. 4,330,790 issued to Burns. One end of the bond wires or foil strips is bonded by conventional techniques to electrically active bonding sites on the face of the electronic device. The opposing end is bonded to the inner lead portion of the lead frame creating an electrical interconnection between the device and leadframe.

A metallic base component is provided. As used throughout this specification, metallic means a metal or a metal alloy. The base contains an adhesive ring around its perimeter. A centrally positioned adhesive pad is also provided. The thickness of adhesive ring is preferably greater than the thickness of the adhesive pad. When the leadframe is bonded to the adhesive ring and the centrally positioned die attach pad is bonded to the adhesive pad, the centrally positioned die attach pad is downset. This configuration is preferred so the face of the integrated circuit device and the lead fingers are on approximately the same horizontal plane.

The leadframe is bonded to the base component by a cure cycle which causes the epoxy to set. The cure cycle is selected so both the adhesive ring about the base component perimeter and the centrally positioned adhesive pad cure simultaneously.

A cover component formed from a metal or metal alloy also contains an adhesive ring about its perimeter. The cover is bonded to the leadframe either simultaneously with the bonding of the leadframe and die attach pad to the base or as a subsequent operation. A vent hole is also provided in the cover component to vent reaction by-products generated during the adhesive cure. The vent hole further minimizes changes in cavity pressure due to expansion and contraction of trapped gases during heating and cooling. After package assembly is completed, a plug seals the vent hole.

Strong adhesion between the package components and the polymer adhesive is required for a reliable package. One method to evaluate adhesion is known as the "pressure cooker test". The test comprises immersion of a sealed package in a pressure cooker at 121° C. at a relative humidity of 100% and a pressure of 30psi. A package which does not delaminate after exposure for a given number of hours, for example 72, is considered acceptable. This test is an accelerated environmental test and indicates how well the package will protect the electronic device from air and moisture.

Coating the metal package components with a second material either formed in situ or deposited on package components has been found to increase polymer adhesion as measured by the pressure cooker test. An in situ coating is formed internally. U.S. Pat. No. 4,461,924 entitled "Semiconductor Casing" issued to Butt and assigned to a common assignee, discloses electronic package components formed from a copper base alloy which contains from 2 to 12% by weight aluminum. The alloys form an in situ refractory oxide coating substantially comprised of aluminum oxide ($Al_2O_3$). To develop the refractory oxide coating, the copper alloy is placed in a container having an atmosphere of 4% hydrogen, 96% nitrogen and trace of oxygen. The gas is heated to a temperature of between about 330° C. and about 820° C. Depending on the temperature and the amount of time the alloy is in the heated gas, a refractory oxide layer With a desired thickness is formed on the surface of the alloy.

U.S. Pat. No. 4,939,316 entitled "Aluminum Alloy Semiconductor Packages" by Mahulikar et al, filed Oct. 5, 1988 and assigned to a common assignee, discloses aluminum and aluminum alloy packages having an anodization layer formed on at least some surfaces. Aluminum alloy 3003, having a nominal composition of about 0.12% by weight copper, about 1.2% by weight manganese and a balance aluminum is disclosed as coated with an anodization layer of from about 10 microinches to about 2000 microinches. The anodization layer is applied by any technique known in the art. One satisfactory anodization solution is an aqueous solution containing about 20 volume percent sulfuric acid at a temperature of about 20° C. The porosity of the anodized layer may be reduced by water or steam sealing. Sealing entails exposing the anodized surface to pressurized steam for from about 30 minutes to about 60 minutes. The anodized surface hydrates to form boehmite ($Al_2O_3.H_2O$) resulting in a volume increase which effectively closes pores in the anodized surface.

U.S. Pat. No. 4,888,859 entitled "Semiconductor Package" by Jacob Crane et al, filed Jan. 4, 1988, and assigned to a common assignee, discloses a metal or metal alloy having a coating formed from a second metal or metal alloy. For example, a copper or copper alloy component is disclosed as coated with nickel which was deposited by ectrolytic means.

The electronic packages disclosed in the above patents and patent applications are adhesively sealed metal packages. Each provides high reliability and excellent thermal conduction to remove heat from the integrated circuit device. It is desirable to provide package components in a kit form so that each of the above packages may be readily manufactured by a standardized assembly process.

Accordingly, it is an object of the invention to provide metal package base and cover components in a kit form. It is a feature of the invention that these components may be adapted to assemble any of the above disclosed electronic packages. It is a further feature of the invention that in one embodiment the base component includes fins to further enhance thermal dissipation. It is an advantage of the invention that electronic packages assembled from the kit readily dissipate heat generated by the electronic device. It is another advantage of the invention that the kits may be assembled with very few processing steps. Still another advantage of the invention is that the polymer adhesive may be tacked to kit components prior to assembly minimizing handling. Yet another advantage of the invention is that adhesive may be provided in either dry sheet or liquid form.

Therefore, in accordance with the invention, there is provided a kit for the assembly of an adhesively sealed electronic package. The kit comprises the combination of a metallic base component and a metallic cover component. The base component is adapted for assembly into an electronic paCkage by having at least those surfaCes which are to receive a polymeric adhesive coated with an adhesion enhancing material. The metallic cover component has a bonding surface for bonding to the first surface of the base component. The bonding surface comprises an outer ring portion and an inner depressed portion. The outer ring portion is adapted to receive a polymeric adhesive and is coated with a second adhesion enhancing layer.

The above stated objects, features and advantages of the invention will be more clearly understood from the specification and drawings which follow, in which like numerals represent like structures and primed numerals represent similar structures performing similar functions.

Figure 1:
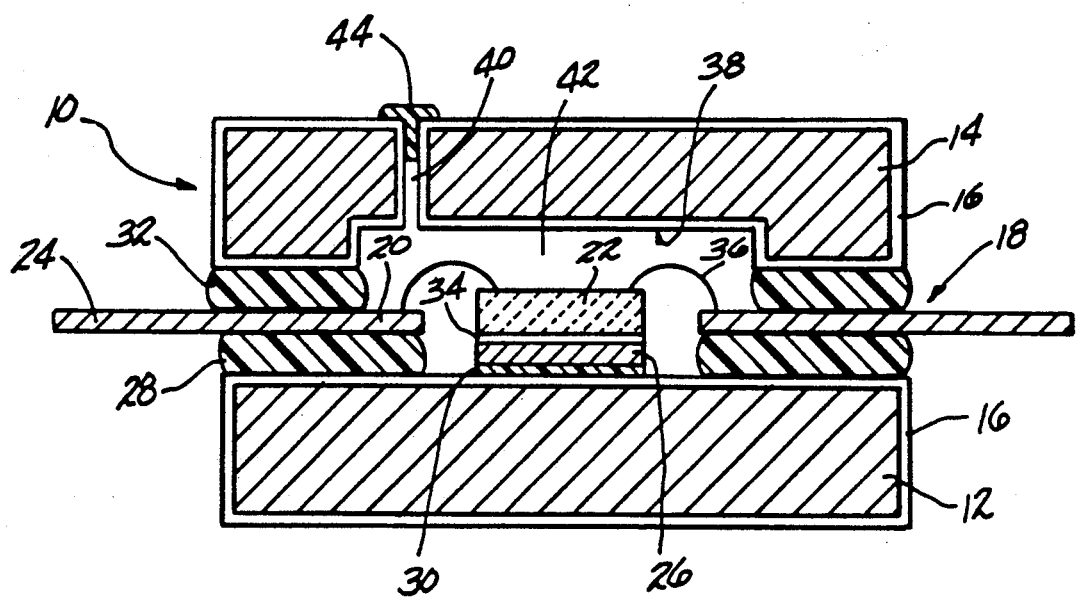
FIG. 1 illustrates in cross-sectional representation a metal electronic package as known from the cited patents and patent applications.

FIG. 1 illustrates in cross-sectional representation an adhesively sealed metal electronic package 10 as disclosed in the cited patents and patent applications. The package 10 includes a metallic base component 12 and a metallic cover component 14. A coating 16 covers at least a portion of the surfaces of the base 12 and cover 14. The coating 16 covers at least those portions which contact a polymeric adhesive. Usually, the coating 16 covers all surfaces and edges of the base component 12 and cover component 14.

Disposed between the base component 12 and cover component 14 is a leadframe 18. The leadframe is made up of a plurality of leads. Each 1 ⓇaAd contains an inner lead portion 20 for electrical interconnection to the electronic device 22 and an outer lead portion 24 to electrically interconnect the electronic device to external circuitry such as a printed circuit board. The leadframe further contains a centrally positioned die attach pad 26 supported by support struts (not shown) which may be severed following completion of package assembly.

A tape leadframe as disclosed in U.S. Pat. application Ser. No. 436,854 by Braden filed Nov. 15, 1989 is also suitable. The tape leadframe may be all metal or comprise one or more conductive layers separated by a dielectric such as polyimide.

A first polymer adhesive 28 bonds the inner lead portion 20 of the leadframe 18 to the base component 12. A second polymer adhesive 30 bonds the centrally positioned die attach pad 26 to the base component 12. A third polymer adhesive 32 bonds the cover component 14 to the leadframe 18. The first 28 and third 32 polymer adhesives, are selected to be electrically nonconductive to electrically isolate the leadframe 18 from the metal or metal alloy base 12 and cover 14 components. The second polymer adhesive 30 is either electrically conductive or electrically insulating depending on whether it is desired to electrically isolate the electronic device 22 from the base component 12 or to electrically ground the device 22 through the base component. Regardless the desired electrical characteristics of the second polymer adhesive 30, the second polymer adhesive is preferably thermally conductive to maximize the dissipation of heat generated by the electronic device 22 during operation.

A die attaCh material 34 bonds the electronic device 22 to the centrally positioned die attach pad 26. The die attach material 34 may be either electrically conductive or electrically insulating dependent on the electrical characteristics of the electronic device 22. As with second polymer adhesive 30, it is preferable that die attach material 34 be thermally conductive to maximize the dissipation of heat from the electronic device 22 to the metal or metal alloy base component 12.

Bond wires 36 or TAB leads (not shown) electrically interconnect the electronic device 22 to the inner leads 20 of the leadframe 18. To ensure the bond wires 36 do not contact the metal or metal alloy cover component 14, an inner depressed portion 38 is formed within the cover component 14. The inner depressed portion 38 increases the clearance between the top face of the electronic device 22 and the cover component 14.

A vent hole 40 may be provided as an aperture through the cover component 14. Corrosive gases, such as chloride, may form as reaction by-products during the adhesive cures. The gases are evacuated from the package cavity 42 by means of the vent hole 40. The vent hole 40 further equalizes the air pressure within the cavity 42 during heating and cooling. When the package is heated, the gases within the cavity 42 expand. Excess gas is vented through the vent hole 40. Following package assembly, the vent hole 40 is sealed. The seal 44 may comprise a solder or polymer adhesive. Most preferably, a polymer adhesive forms the seal 44.

The present invention is drawn to a kit to manufacture a metal electronic package 10 of the type illustrated in FIG. 1. The kit comprises in combination at least two elements: a base component and a cover component. Other elements which may be included in the kit include a leadframe and a window frame. The leadframe 18 is a conventional leadframe known in the prior art and includes a centrally positioned die attach pad 26. Alternatively, a tape leadframe or a tape automated bonding (TAB) site may be used.

The leadframe 18 is comprised of an electrically conductive material. Leadframes are typically fashion ®d from Alloy 42 (an iron/nickel alloy containing 58%Fe and 42%Ni), KOVAR (an iron/nickel/cobalt alloy containing 54% Fe, 29% Ni and 17% Co), copper or a copper based alloy. The leadframe may be plated or clad with a second material to enhance bonding to the sealant, improve corrosion resistance or improve appearance. Preferably, the leadframe is a dilute copper alloy. A dilute copper alloy is essentially copper with trace concentrations of additives. These alloys are characterized by high electrical conductivity compared to other alloys and high strength when compared to copper. A typical dilute copper alloy for use in a leadframe is C194 (2.35% Fe, 0.03%p, 0.12% Zn and the balance copper).

Figure 2:
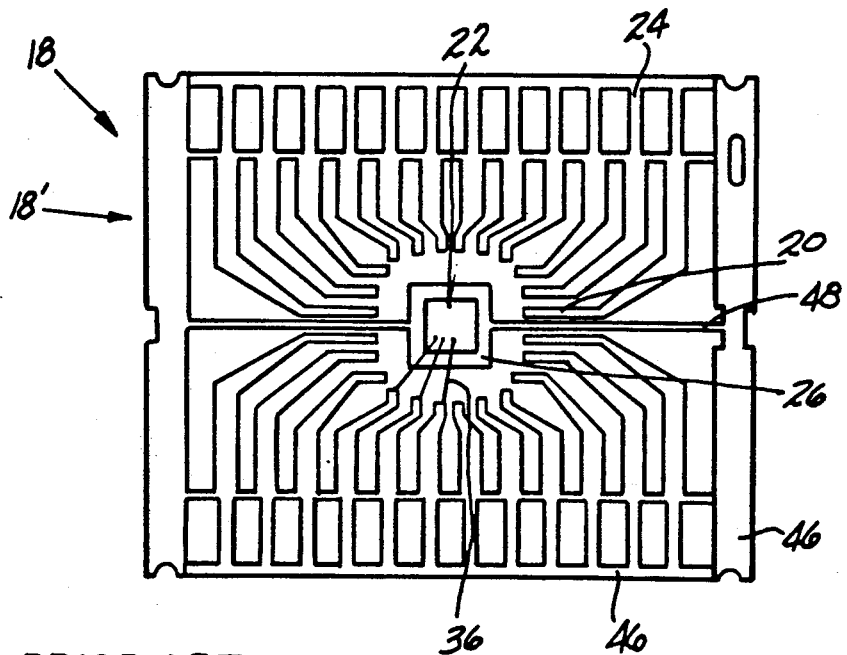
FIG. 2 illustrates in top planar view a leadframe containing a centrally positioned die attach pad as known from the prior art.

The leadframe 18 is comprised of plurality of 1 ®ad fingers. The lead fingers have an inner lead portion 20 disposed about the centrally positioned die attach pad 26 as shown in top planar view in FIG. 2. Outer lead portions 24 electrically connect the electronic device 22 to external circuitry. The leadframe usually contains tie bars 46 to support the lead fingers during assembly operations. The tie bars 46 are usually severed once the leadframe 18 is in place thereby electrically isolating leads from one another. The centrally positioned die attach pad 36 is connected to the tie bars 46 by support struts 48. The support struts may be severed once the centrally positioned die attach pad 26 is bonded to a base component. The use of a die attach pad in a plastic encapsulated package is disclosed in U.S. Pat. No. 4,697,203, issued to Sakai et al. The use of a die attach pad with a metal package is disclosed in U.S. Pat. No. 4,656,499.

An electronic device 22 is bonded to the centrally positioned die attach pad 26 by a die attach 34. The electronic device 22 is then electrically interconnected to the inner lead fingers 20 by either bond wires or TAB. The leadframe assembly 18' comprising the leadframe 18, attached electronic device 22 and bond wires 36 comprises one optional element of the kit. The leadframe assembly 18' is provided by either the chip manufacturer or the package manufacturer. If provided by the chip manufacturer, the leadframe does not form an element to the package kit.

Figure 3:
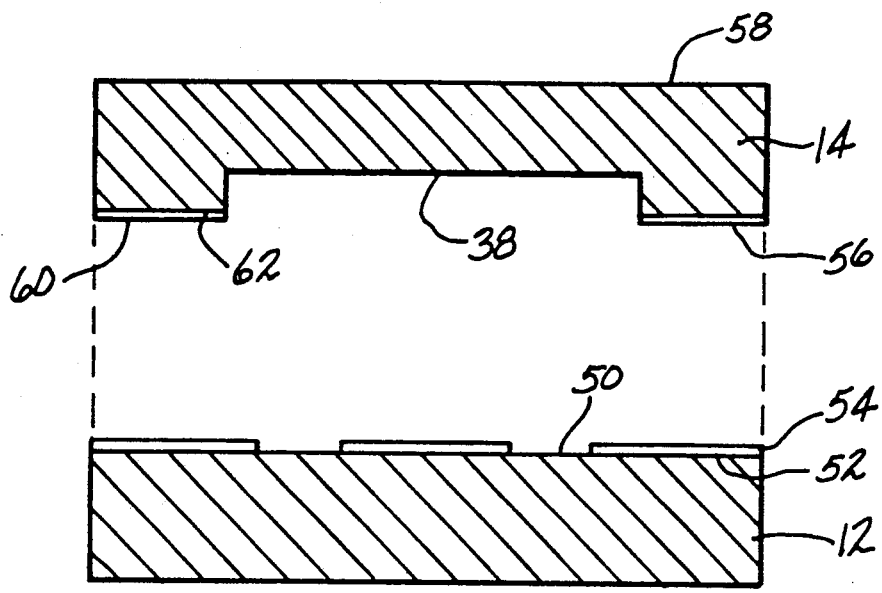
FIG. 3 illustrates in cross sectional representation base and cover component elements of the kit of the invention.

The basic kit of the invention is illustrated in cross-sectional representation in FIG. 3. The kit includes a base component 12 and a cover component 14. The metallic base component is preferably formed from aluminum or an aluminum based alloy to maximize thermal conductivity with a minimum weight penalty. A most preferred aluminum alloy is aluminum alloy 3003.

A first surface 50 of the base component 12 is adapted to receive a polymer adhesive. The adhesive does not adequately adhere to aluminum or an aluminum based alloy as determined by the pressure cooker test. Those portions 52 of the first surface 50 which will receive the polymer adhesive are coated with a first adhesion enhancing material 54 The adhesion enhancing coating may be a metal which forms an adherent oxide coating such as nickel, tin, cobalt, chromium, molybdenum, tungsten, titanium, zirconium, hafnium, niobium, tantalum, germanium, or aluminum. Alloys of these metals may also be employed as may their oxides. Preferably the first adhesion enhancing coating 54 is a hydrated aluminum oxide or anodized layer.

The anodized layer is applied by any conventional anodization process, which may comprise immersion into a chemical solution, either with or without the addition of electrolysis. It is preferable to extend the anodization layer to at least over those surfaces in contact with the first and second polymer adhesives and to those surfaces exposed to the external environment. This is because the anodization layer inhibits salt spray corrosion of the aluminum base component 12.

The metallic cover component 14 comprises the second element of the kit of the invention. The cover component 14 has a bonding surface 56 which has generally the same peripheral dimensions as the first surface 50 of the base component 12. When the package is assembled, the bonding surface 56 is adhesively joined to the first surface 50 with a leadframe disposed within the adhesive joint. The opposing surface 58 of the cover component 14 forms an exterior surface of the assembled package.

The bonding surface 56 has an outer ring portion 60 and an inner depressed region 38. The outer ring portion 60 is adapted for receiving a polymer adhesive and contains a second adhesion enhancing coating 62. The second adhesion enhancing coating is individually selected from the same materials as employed for the first coating 54 as described above. Preferably, the second adhesion enhancing coating 62 is also an anodized aluminum layer.

The inner depressed region 38 of the cover component 14 is a relative shallow depression and occupies from about 10% to about 75% the overall thickness of the cover component and is usually from about 0.01 inches to about 0.05 inches deep. The depression increases the cavity depth to provide space to encase the electronic device and bond wires and ensure both the device and wires are electrically isolated from the metallic cover component. In some applications, it is preferable that the surface of the centrally positioned depression is not coated with a second metal or oxide. The exposed metal acts as a getter to attract water vapor and oxygen which may be within the enclosed package as disclosed in U.S. Pat. No. 4,769,345 to Butt et al and assigned to a common assignee.

While not a necessary element of the kit, the polymeric resin adhesive may be provided as an element. The adhesive may be provided in any suitable form, for example, dry sheet, paste, powder, gel or liquid. For ease handling and dimensional tolerances, dry sheet form is preferred.

The dry sheet may further be stamped into a first, second and third adhesive piece. The first adhesive piece is a ring for bonding the base component to the cover component. The second is a generally rectangular portion for bonding the base component to the centrally positioned die attach pad of a leadframe. The third polymeric adhesive is also a ring portion an is for bonding the cover component to the leadframe.

An adhesive portion to form a plug for sealing the vent hole subsequent to package assembly may also be provided.

Each polymer adhesive is selected to be "semiconducter grade". This grade of adhesive generates a relatively low level of ionic contamination. The adhesive is selected such that excessive contaminants are not generated during the cure reaction. The reaction by-product contaminants frequently contain chloride ions and are corrosive. If deposited on the bond wires or the metalized face of the electronic device damage to the conductive patterns and device failure may result.

When the package is assembled, the electronic device is already attached to the leadframe. The cure temperature of the first polymer adhesive should be sufficiently low that the electronic device is not damaged during the cycle. Preferably, the cure temperature of the first polymer adhesive is below about 190° C.

A preferred material for the first polymer adhesive is a thermal setting epoxy resin. One such suitable resin is Ablestik 550 manufactured by Ablestik Labs, Gardenia, CA.

Figure 4:
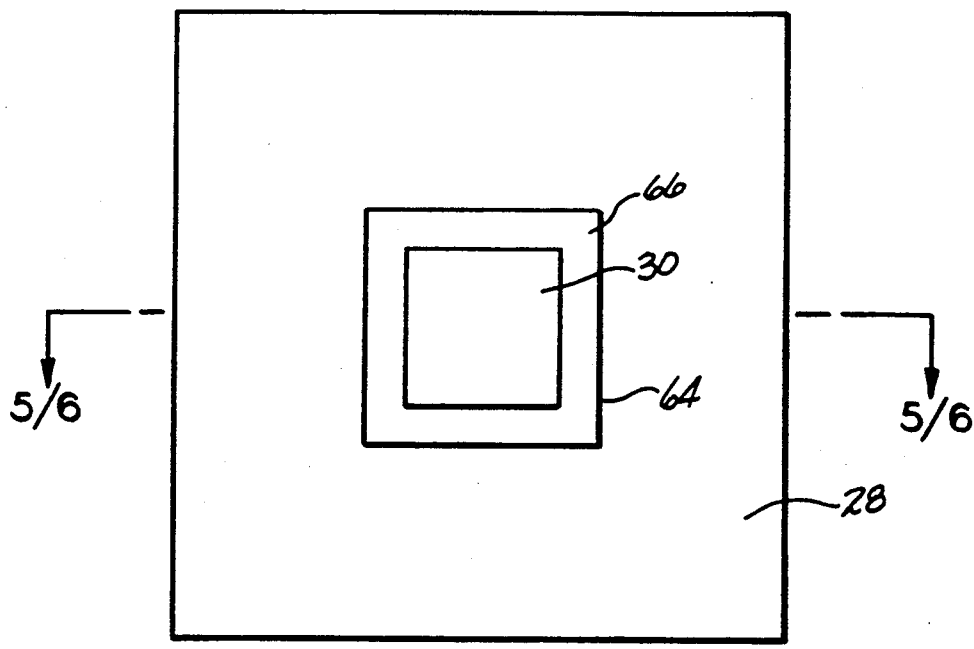
FIG. 4 illustrates in top planar view a base component having an adhesive ring and a centrally positioned adhesive pad tacked thereto.
Figure 5:
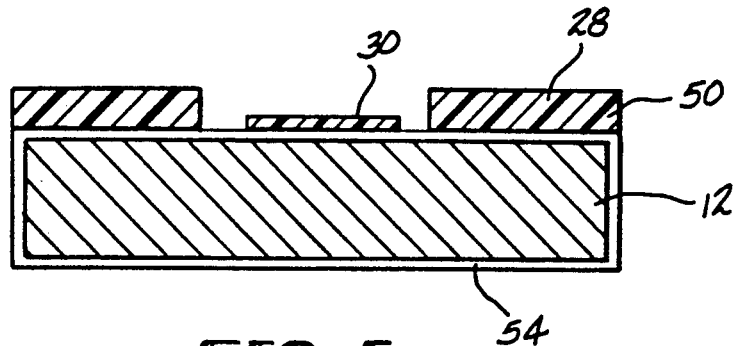
FIG. 5 illustrates in cross-sectional representation the base component of FIG. 4 showing the exterior coating and relative thicknesses of the adhesive ring and the centrally positioned adhesive pad in accordance with and embodiment of the invention.

While the adhesives may be provided as separate portions within the kit, it is preferable to tack the adhesives to the first surface of the base component and to the bonding surface of the cover component as illustrated in FIGS. 4 and 5. "Tack" is used in its common meaning in the art, that is the adhesive is bonded without initiating complete polymerization. The first polymer adhesive 28 extends from the edge of the base component 12 to a desired interior point 64. The interior point 64 is determined by the inner lead fingers of the leadframe. It is desirable for the first adhesive 28 to extend close to the ends of the inner lead fingers without actually reaching that point. If the first polymer adhesive extends beyond the ends of the inner leads, the wire bonds at the lead fingers may be damaged.

The interior portion 64 of the first adhesive defines a centrally positioned aperture 66. Centered within the aperture is a second polymer adhesive 30. The thickness of the second polymer adhesive 30 is less than the thickness of the first polymer adhesive 28. The second polymer adhesive 30 bonds the centrally positioned die attach pad to the base component 12. It is desirable that the centrally positioned die attach pad be downset from the inn ®r lead fingers. By downsetting, the inner leads ar ®more closely on the same horizontal plane as the top face of the electronic device facilitating automated wire bonding. Also, by downsetting the centrally positioned die attach pad, the support struts are out of the plane of the inner lead fingers and the likelihood of an electrical short circuit is reduced.

The second polymer adhesive 30 is preferably thermally conductive. The adhesive may be made conductive by the addition of metal filler powder. A typical filler is silver with a diameter of from about 1 to about 10 microns. By controlling the concentration of the filler powder, the second adhesive 30 may be made electrically conductive or electrically non-conductive. The same adhesive may be used for the first 28 and second 30 polymer adhesives and the cure cycles will be identical. This is desirable because during assembly of the kit, the first and second polymer adhesives are bonded to the leadframe and centrally positioned die attach pad, respectively, simultaneously.

The length and width of second polymer adhesive 30 is determined by the size of the centrally positioned die attach pad. It is desirable that the adhesive be approximately the same size as the die attach pad or slightly smaller. This is so the second adhesive does not creep up on the face of the die attach pad. It is desirable to provide a sufficiently limited volume of second polymer adhesive so that centrally positioned aperture 66 is not filled in during the cure. The centrally positioned aperture prevents the second polymer adhesive from contacting the inner lead fingers of the leadframe.

The first 28 and second 30 polymer adhesives are tacked to the base component 12 with the first adhesive enhancing coating 54 disposed between the adhesive and the base metal. Tacking with the preferred epoxy adhesives is accomplished by heating the base component to a temperature of from about 35° C. to about 100° C. for a time of from about 1 minute to about 10 minutes. The tacking operating is generally carried out in air, although if the coating 54 does not extend to all surfaces of the base component 12 a neutral or reducing atmosphere may be used to prevent excessive oxidation. When the first and second polymer adhesives are properly properly tacked to the first surface 52 of the base component 12, the base component element of this embodiment of the kit is complete.

Figure 6:
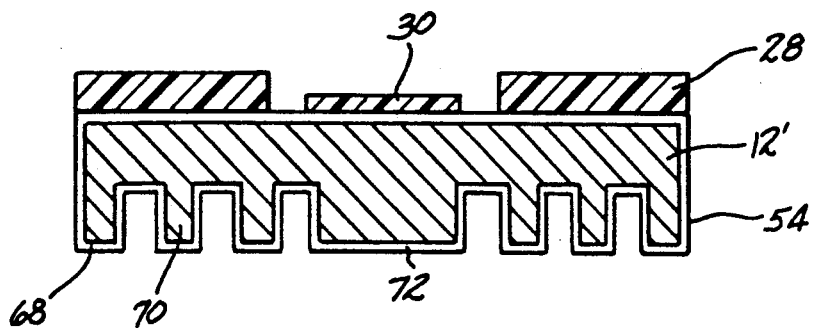
FIG. 6 illustrates in cross-sectional representation a second base component embodiment of the kit including fins to enhance thermal dissipation.

FIG. 6 illustrates in cross-sectional representation a preferred embodiment of the base component assembly 12' of the invention. This embodiment utilizes the metals and coatings as previously disclosed The same dimensional constraints are applied to the first 28 and second 30 polymer adhesives. The second surface 68 of the base component 12' is provided with a plurality of fins 70. The fins increase surface area and maximize thermal dissipation. The fins may be provided across the entire second surface 68 or over a portion of the base. It is preferable to provide base assembly 12' with an fin free portion 72. When the kit is provided to a kit manufacturer, the manufacturer marks the package to identify the encased chip. The unfinned portion provides a flat, centrally positioned region for package marking.

With reference to FIGS. 4 and 5, if the base component is not an alloy capable of forming an in situ refractory oxide coating or receiving anodization, the coating 58 may comprise a second metal or metal alloy deposited on the base component. The second metal or metal alloy may be deposited by electrolytic or electroless means. The second metal or metal alloy is selected to be one which either forms a refractory oxide or provides better adhesion to the polymer adhesive. Among the preferred second metals are nickel, iron and chromium. A matte finish nickel applied by electrolytic means is preferred. This type of exterior coating provides exceptional polymer adhesion.

An aluminum alloy having an adhesion enhancing coating layer 54 comprising an anodization layer over all surfaces is preferred for both base component assemblies 12, 12'. Aluminum has only 60% the weight of a comparable copper or copper alloy base. Yet the aluminum alloy is as effective as a copper base alloy in removing h(R)at from an electronic device.

Figure 7:
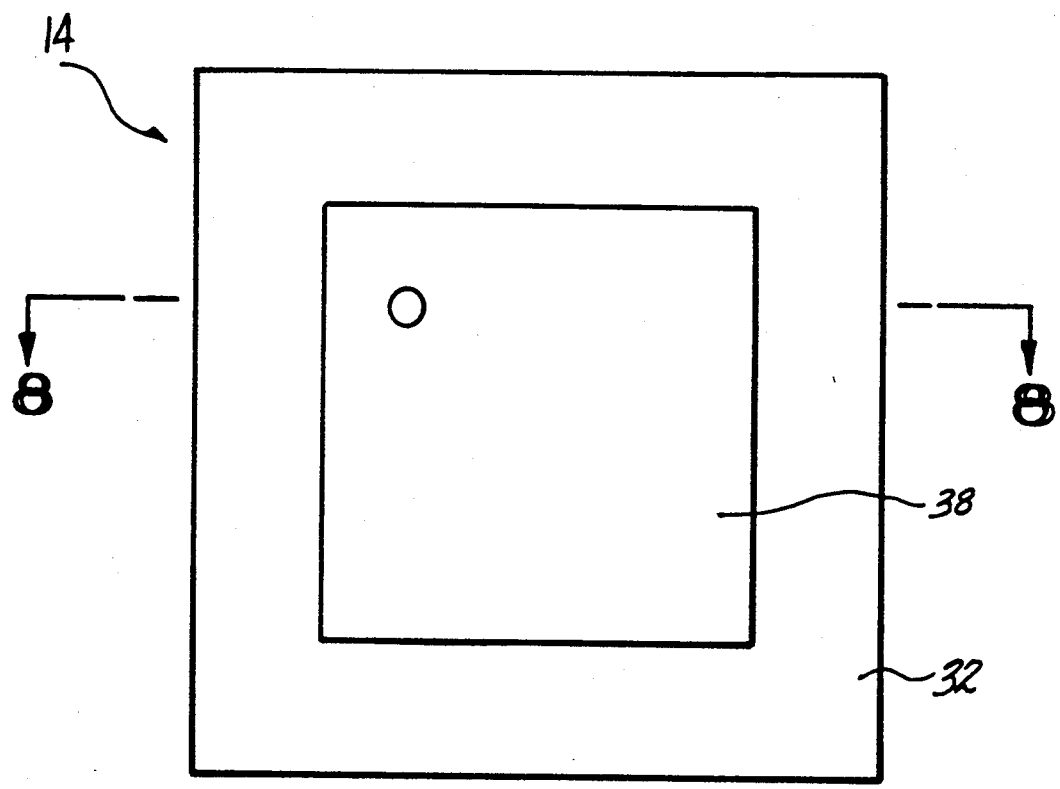
FIG. 7 illustrates in bottom planar view an element of the kit of the invention comprising a cover component having an adhesive ring, centrally positioned depression and vent hole.
Figure 8:
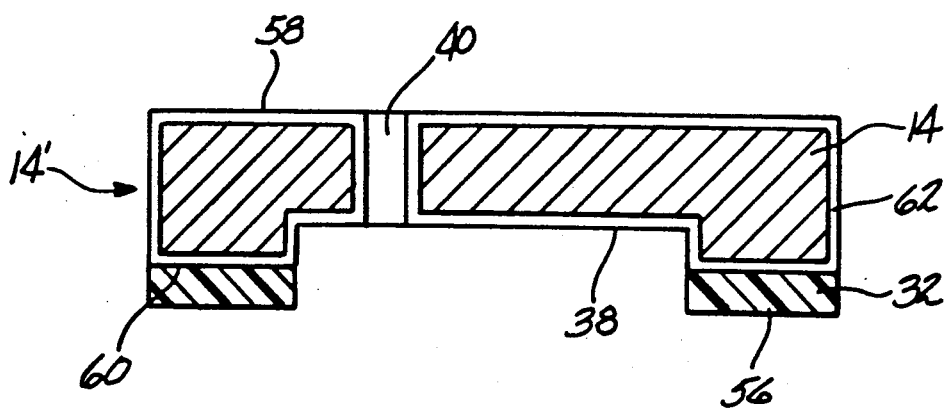
FIG. 8 illustrates in cross-sectional representation the cover component illustrated in FIG. 7 showing the exterior coating, positioning of the vent hole, centrally positioned and adhesive ring.

The metallic Cover component with tacked polymer adhesive assembly 14' is illustrated in bottom planar view in FIG. 7 and in cross-sectional representation in FIG. 8. The assembly includes a cover component 14 having a second adhesion enhancing coating 68 over at least those surfaces in contact with the third polymer adhesive 32. While the cover component 14 may be any suitable metal or metal alloy, aluminum alloys are preferred. As discussed hereinabove, the exterior coating layer may be formed either in situ, by deposition of a second metal or metal alloy, or via anodization. Each of the metals and alloys described above for the base component and each coating method described hereinabove is equally applicable to the cover component.

The third polymer adhesive 32 is tacked to the bonding surface 56 of the cover component. The third polymer adhesive 32 is selected to be electrically non-conductive to isolate the leadframe from the cover component 14. The third polymer adhesive 32 is tacked to the cover component using an appropriate thermal profile. Generally, the third polymer adhesive 32 is selected to be identical to the first polymer adhesive and a similar thermal profile is employed.

A vent hole 40 is provided within the inner depressed region 38 of the cover. The vent hole extends from the bonding surface 56 to the opposing surface 58 providing a passageway for gases during assembly. As discussed above, following package assembly, an adhesive plug seals the vent hole 40.

The dimensions of the second adhesive 32 are determined by the inner depression 38, which is determined by the size of the electronic device and spacing between the electronic device and the inner lead fingers. The inner depression 38 is sufficiently large so that the bond wires contact the inner lead fingers at a point within the depression. The third adhesive 32 is provided in ring form. The width of the adhesive is about equal to the width of the outer ring portion 60 of the cover component. The width of the third adhesive 32 may not be substantially less than the width of the outer ring 60 to maintain electrical isolation between the leadframe and the cover component. If width of the third adhesive 32 is substantially larger than width of the outer ring 60, adhesive runout along the lead fingers is likely Yet another embodiment of the kit of the invention is illustrated in cross-sectional representation in FIG. 9. In this embodiment, the kit includes a window frame component 74. The window frame has approximately the same inside and outside peripheral dimensions as the third adhesive ring bonded to the cover component 14.

The window frame may be formed from any suitable metal or metal alloy and is preferably an aluminum alloy similar to the base and cover components. The surfaces and preferably also the edges of the window frame are coated with a second material to enhance polymer adhesion. Typically, the window frame will be an aluminum alloy and the coating an anodized layer.

A fourth polymer adhesive 76 may be provided to bond the window frame 74 to the leadframe adjacent to the first surface 50 of the base component 12. The fourth adhesive, further, may be tacked to the window frame if desired.

Figure 9:
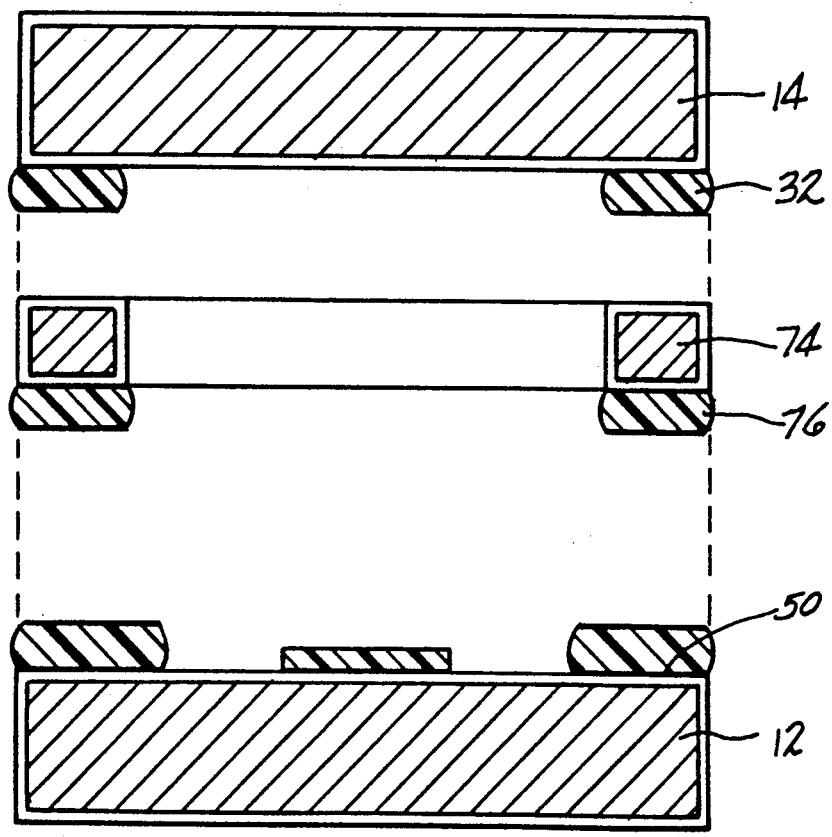
FIG. 9 illustrates in cross-sectional representation yet another embodiment of the kit of the invention including a window frame component.

When a window frame the package is assembled, the window frame provides space within the package cavity for the electronic device and bond wires. Therefore, the central depression of the cover component is optional and may be omitted as shown in FIG. 9.

The kits of the invention are provided in one of three forms. The kit may inClude only the package components, that is the base and cover or optionally include the polymer adhesive either separately or tacked to the components. The package assembler provides a leadframe having the electronic device electrically interconnected thereto. The leadframe is disposed between the base component assembly and the cover component assembly and the first, second and third polymer adhesives are cured simultaneously. A typical cure cycle for the preferred epoxies disclosed above will involve a temperature of from about 120° C. to about 190° C. at a pressure of from about 0.1 psi to about 5 psi.

In the second form, the kit also includes a window frame and assembly comprises bonding the base and window frame to the leadframe at the same time as the centrally positioned die attach pad is bonded to the base component. The cover component may then be bonded to the opposite side of the window frame in a subsequent operation.

In yet another form, the kit includes a leadframe either with or without the electronic device. Assembly then proceeds as above.

The advantages of the kit of the invention are readily apparent. A single step encapsulates the electronic device In the embodiments including tacking, resin is not handled by the assembler and resin alignment is not a concern during assembly. Alternatively, the leadframe assembly may be bonded to base component assembly in one operation and the cover component assembly bonded in a subsequent operation.

The patents and patent applications set forth in the specification are intended to be incorporated by reference herein.

It is apparent that there has been provided in accordance with this invention a kit for the assembly of electronic packages which fully satisfies the objects, means and advantages set forth herein above. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A kit for the assembly of an adhesively sealed package designed to encase an electronic device, which kit comprises:

a metallic base component selected from the group consisting of aluminum and aluminum based alloys, said base component having a first surface and an opposing second surface, said first surface having at least selected portions thereof adapted to receive a polymeric adhesive by coating with an anodization layer; and a metallic cover component selected from the group consisting of aluminum and aluminum based alloys, said cover component having a bonding surface for bonding to the first surface of said base component and an opposing surface, said bonding surface having an outer ring portion and an inner depressed portion bordered by said ring portion, said ring portion adapted to receive a polymeric adhesive and coated with an anodization layer.

2. The kit of claim 1 wherein all surfaces and edges of said metallic base component and of said metallic cover component are coated with said anodization layer.

3. The kit of claim 1 wherein said metallic base and cover components are formed from aluminum alloy 3003.

4. The kit of claim 1 wherein said second surface of said metallic base component contains a plurality of fins.

5. The kit of claim 4 wherein a central portion of said base component is free of fins.

6. The kit of claim 1 wherein said inner depressed portion of said metallic cover component includes a vent hole extending through said metallic cover component.

7. The kit of claim 1 wherein a sufficient quantity of a polymeric adhesive is provided as an element of the kit in dry sheet, paste, powder, gel or liquid form.

8. The kit of claim 7 wherein said polymeric adhesive is provided in the form of a dry sheet.

9. The kit of claim 8 wherein said polymeric adhesive is provided in the form of first, second and third sheets of adhesive, said first sheet of adhesive comprising a ring for bonding said base component to a leadframe, said second sheet of adhesive comprising a generally rectangular portion for bonding said metallic base component to a centrally positioned die attach pad of said leadframe and said third sheet of adhesive comprising a ring for bonding said metallic cover component to said leadframe.

10. The kit of claim 9 wherein said kit includes an adhesive vent plug for sealing the vent hole in said metallic cover component.

11. The kit of claim 9 wherein said first and second sheets of adhesive are tacked to said metallic base component and said third sheet of adhesive is tacked to said metallic cover component.

12. A kit for the assembly of an adhesively sealed package designed to encase an electronic device, which kit comprises:

a metallic base component selected from the group consisting of aluminum and aluminum base alloys, said base component having a first surface and an opposing second surface, said first surface having at least selected portions thereof adapted to receive a polymeric adhesive by coating with an anodization layer;

a metallic cover component selected from the group consisting of aluminum and aluminum based alloys, said metallic cover component having a bonding surface for bonding to a window frame component and an opposing surface, said bonding surface having an outer ring portion and an inner portion bordered to said ring portion, sand ring portion adapted to receive a polymeric adhesive and coated with an anodization layer; and said window frame component selected from the group consisting of aluminum and aluminum base alloys having an anodization layer coating all surfaces and edges, said surfaces adapted to receive a polymeric adhesive.

13. The kit of claim 12 wherein said polymeric adhesive is provided in the form of first, second, third and fourth sheets of adhesive, said first sheet of adhesive comprising a ring for bonding said metallic base component to a leadframe, said second sheet of adhesive comprising a generally rectangular portion for bonding said metallic base component to a centrally positioned die attach pad of said leadframe, said third sheet of adhesive comprising a ring for bonding said metallic cover component to said window frame component and said fourth sheet of adhesive comprising a ring for bonding said window frame component to said leadframe.

14. The kit of claim 13 wherein said kit includes an adhesive vent plug for sealing a vent hole in said metallic cover component.

15. The kit of claim 13 wherein said first and second sheets of adhesive are tacked to said metallic base component, said third sheet of adhesive is tacked to said metallic cover component and said fourth sheet of adhesive is tacked to said window frame component.

* * * * *